US010315424B2

(12) United States Patent
Reinten

(10) Patent No.: US 10,315,424 B2
(45) Date of Patent: Jun. 11, 2019

(54) METHOD OF MANUFACTURING AN INKJET PRINT HEAD

(71) Applicant: Océ Holding B.V., Venlo (NL)

(72) Inventor: Hans Reinten, Venlo (NL)

(73) Assignee: OCÉ HOLDING B.V., Venlo (NL)

( * ) Notice: Subject to any disclaimer, the term of this patent is extended or adjusted under 35 U.S.C. 154(b) by 111 days.

(21) Appl. No.: 15/656,810

(22) Filed: Jul. 21, 2017

(65) Prior Publication Data

US 2018/0029366 A1 Feb. 1, 2018

(30) Foreign Application Priority Data

Jul. 28, 2016 (EP) .................................... 16181695

(51) Int. Cl.
*H01L 41/22* (2013.01)
*H04R 17/00* (2006.01)
*B41J 2/16* (2006.01)
*B41J 2/14* (2006.01)

(52) U.S. Cl.
CPC ......... *B41J 2/1612* (2013.01); *B41J 2/14233* (2013.01); *B41J 2/161* (2013.01); *B41J 2/1623* (2013.01); *B41J 2002/14258* (2013.01)

(58) Field of Classification Search
CPC ...... B41J 2/1612; B41J 2/161; B41J 2/14233; B41J 2/1623; B41J 2002/14258; Y10T 29/42; Y10T 29/49128
USPC ................................................. 29/25.35, 831
See application file for complete search history.

(56) References Cited

U.S. PATENT DOCUMENTS 7,594,308 B2 * 9/2009 Sugahara ................. B41J 2/161 29/25.35
2006/0117563 A1 6/2006 Sugahara
2016/0121611 A1 * 5/2016 Reinten ................ B41J 2/14233 347/71

FOREIGN PATENT DOCUMENTS

JP 2010-214789 A 9/2010
WO WO 2015/010985 A1 1/2015

OTHER PUBLICATIONS

European Search Report issued in EP 16 18 1695, dated Jan. 6, 2017.

* cited by examiner

*Primary Examiner* — Donghai D Nguyen
(74) *Attorney, Agent, or Firm* — Birch, Stewart, Kolasch & Birch, LLP

(57) ABSTRACT

An inkjet print head comprises a fluid channel, the fluid channel including a pressure chamber; a piezo actuator including an active piezo stack and a membrane, the active piezo stack being provided at a surface of the membrane and the membrane forming a flexible wall of the pressure chamber, and a cavity having a cavity dimension determining a wall dimension of the membrane. The method of manufacturing such a print head includes selecting a desired actuator compliance; manufacturing a first print head layer including the piezo actuator; determining at least one actual actuator property of the piezo-actuator; determining a desired wall dimension based on the actual actuator property such that the combination of the piezo actuator and the membrane having the desired wall dimension provides for the desired actuator compliance; and manufacturing a second print head layer including the cavity.

6 Claims, 3 Drawing Sheets

METHOD OF MANUFACTURING AN INKJET PRINT HEAD

FIELD OF THE INVENTION

The present invention generally pertains to a piezo-actuated inkjet print head, a method of designing such a print head and a method for testing such a print head, wherein the print head is provided with a piezo actuator arranged for generating a pressure wave in a liquid in a pressure chamber such to expel a droplet of the liquid through a nozzle orifice.

BACKGROUND ART

Inkjet print heads for generating and expelling droplets of fluid are well known in the art. A number of actuation methods are known to be employed in such print heads. In a known inkjet print head, a piezo stack, comprising a first electrode, a second electrode and a piezo-material layer therebetween, is driven to deform a flexible wall of a pressure chamber such that a pressure wave is generated in a fluid present in the pressure chamber. The pressure chamber is in fluid communication with a nozzle orifice of the print head and the pressure wave is such that a droplet of the fluid is expelled through the nozzle orifice.

In order to actuate, a drive voltage is applied to the piezo stack, which piezo stack acts as a capacitor. Suitable drive circuitry supplies an actuation voltage and corresponding current. In order to generate and supply such drive voltage and current, power is consumed and heat is generated in the drive circuitry. In present inkjet print heads made using semiconductor technology (micro electromechanical systems (MEMS) technology) a high density arrangement of nozzle orifices and corresponding actuators is obtainable. However, in such high density arrangements and operating at a high frequency, a relatively large amount of heat is generated in the drive circuitry, including in any electrodes in the inkjet print head. A density of an arrangement of electrodes and a cross-section of each electrode (determining an electrical resistance in the electrodes) becomes limited due to which the design of such print heads becomes limited. Further, due to heat generation in the voltage generating circuitry, incorporating the voltage generating circuitry in the inkjet print head is not feasible. It is advantageous to have a print head design in which a relatively low amount of heat is generated. Such a design is disclosed in WO2015/010985, for example.

The disclosed inkjet print head comprises a fluid channel for holding a channel amount of fluid. The fluid channel comprises a pressure chamber in fluid communication with the nozzle orifice. The inkjet print head further comprises a piezo actuator. The piezo actuator comprises an active piezo stack and a membrane. The active piezo stack comprises a first electrode, a second electrode, and a piezo-material layer arranged between the first and the second electrode. The active piezo stack is provided at a surface of a membrane, which membrane forms a flexible wall of the pressure chamber.

It is noted that it is common that the active piezo stack is arranged opposite to the pressure chamber, but it is contemplated that, in an embodiment, the active piezo stack may be arranged at a pressure chamber side of the membrane.

As used herein, the flexible wall is a wall or part of a wall of the pressure chamber which wall or part of the wall is enabled to bend. Hence, a wall dimension of the membrane forming the flexible wall, in particular length and width of the flexible wall, may be determined by dimensions of the pressure chamber, but may as well be determined by other structural elements.

The fluid channel, when holding the channel amount of fluid, has a fluid channel compliance and the piezo actuator has an actuator compliance. The fluid channel compliance has a number of contributions, inter alia from a compliance resulting from the amount of fluid present and a compliance resulting from the print head structure, including the compliance of the materials used. It is noted that the actuator compliance is not included in the fluid channel compliance; adding the actuator compliance and the fluid channel compliance results in a total system compliance or, in other words, the fluid channel compliance corresponds to the total system compliance minus the actuator compliance. In accordance with the present invention, the actuator compliance is larger than the fluid channel compliance. Preferably, the actuator compliance is significantly—e.g. 2, 3, 5, 10 or even more times—larger than the fluid channel compliance. Such a design is thus sensitive to actual compliances of certain parts of the print head.

In more detail and as disclosed in WO2015/010985, an acoustic design of a piezo-actuated inkjet print head is inter alia defined by an unloaded volume displacement of the actuator in response to a drive voltage and by the total system compliance. Such acoustic design determines the droplet generation, including a droplet generation frequency. When designing an inkjet print head and starting from print head requirements, an acoustic design may be selected. Then, in order to optimize an energy consumption without affecting the acoustic design, a ratio between the fluid channel compliance and the actuator compliance may be selected, provided that the total system compliance fits the acoustic design. As is described in more detail hereinbelow in relation to FIG. 2, an energy coupling coefficient indicating an energy efficiency of the print head acoustics, i.e. the droplet forming process, compared to the electrical energy input, is defined by $$ECC_{acoustics} = k^2 \frac{B_{act}}{B_{act} + B_{chan}} \quad \text{(Eq. 1)}$$

Energy efficiency is improved if the energy coupling coefficient ECC is increased. Based on Eq. 1, it is apparent that the energy coupling coefficient $ECC_{acoustics}$ of the print head acoustics is increased when the actuator compliance $B_{act}$ is selected to be higher than the fluid channel compliance $B_{chan}$. The term $k^2$ is an actuator energy coupling coefficient that has a certain optimal value. Based on such optimal value, the actuator compliance $B_{act}$ may be deemed defined. Therefore, in practice, it may be considered that designing the inkjet print head to have a relatively low fluid channel compliance compared to the actuator compliance is a well suited method for improving the energy efficiency. Using a relatively low fluid channel compliance, an energy coupling coefficient will be relatively high and consequently, an overall energy efficiency of the print head is improved. As a consequence, a low driving voltage/low current may be used for driving the print head and thus power dissipation in the drive circuitry is decreased.

As the actuator compliance is a major contributor in the total system compliance, which has a significant contribution in defining the print head design, the actuator compliance is an important aspect to be accurately realized in an actual print head.

In practice, however, a manufacturing accuracy of a large number of features influences the resulting actuator compliance and defining manufacturing tolerances for each of such features may result in very strict tolerances that increase the costs for the print head manufacturing significantly or would even prohibit manufacturing as such strict tolerances may not be feasible. Therefore, in prior art, the inkjet print heads are manufactured in large quantities using not so strict tolerances. Then, the actuator compliance of the resulting print heads may be determined. In many instances the inaccuracies in the manufacturing compensate each other resulting in a sufficient number of print heads meeting the requirements on actuator compliance. Discarding of the print heads that do not have an actuator compliance within a desired actuator compliance range may thus be more cost effective and realistic than posing very strict manufacturing accuracies. Still, discarding of assembled print heads results in unnecessary costs and significantly reduced profits.

It is therefore an object of the present invention to increase a manufacturing yield of inkjet print heads of the above described type.

SUMMARY OF THE INVENTION

The object is achieved in a method according to claim 1, wherein the method comprises the steps of a. selecting a desired actuator compliance;
b. manufacturing a first print head layer comprising the piezo actuator;
c. determining at least one actual actuator property of the piezo-actuator manufactured in step b;
d. determining a desired wall dimension based on the actual actuator property determined in step b such that the combination of the piezo actuator manufactured in step b and the membrane having the desired wall dimension provides for the desired actuator compliance selected in step a;
e. manufacturing a second print head layer comprising a cavity, the cavity having a cavity dimension corresponding to the desired wall dimension determined in step d such that the piezo actuator of the assembled inkjet print head has an actual actuator compliance corresponding to the desired actuator compliance, wherein the cavity is arranged such that said cavity dimension determines said wall dimension.

While in WO2015/010985, it is suggested to manufacture an actuator having specific desired actuator compliance by controlling all tolerances and/or discarding of print heads having a deviating actuator compliance, it is the present insight of the inventors that the difficult controllable tolerances are present in the first print head layer, manufactured separately from the second print head layer, while the second print head layer affects the actual actuator compliance. Therefore, it is proposed to first manufacture the first print head layer, assess one or more properties of the first print head layer and to adapt a pressure chamber dimension embodied in the second print head layer to ensure that the resulting print head has the desired actuator compliance. In more detail, the first print head layer comprises the active piezo stack and the membrane. The piezo stack has a number of layers, wherein the layer thicknesses all contribute to the compliance. Further, the membrane thickness is a major contributor to the actuator compliance and is difficult to maintain constant over subsequent batches of wafers. So, over time, the membrane thickness may change slowly but considerably, affecting the resulting actuator compliance.

On the other hand, the cavity arranged in the second print head layer determines a length and/or a width of the flexible wall. The length and the width of the flexible wall determine, together with other properties of the piezo actuator, the actuator compliance. So, by adapting the length and/or width of the cavity allows to control the actual actuator compliance of the resulting inkjet print head by compensating for a deviation in the first print head layer, for example for a deviation in the membrane thickness.

In an embodiment of the method of manufacturing an inkjet print head according to the present invention, step c of the method comprises the steps of performing impedance spectroscopy on the first print head layer to obtain an impedance spectrum; and deriving from the impedance spectrum the actual actuator property. Impedance spectroscopy allows determining one or more relevant properties of the actually manufactured actuator, wherein such properties allow determining the dimension of the pressure chamber needed to ultimately obtain the desired actuator compliance. Such needed dimension is easily and accurately obtainable by suitably applying commonly known etch processing to a silicon wafer, for example.

In an embodiment of the method of manufacturing an inkjet print head according to the present invention, step c of the method comprises the step of determining an actual dimension of the piezo actuator. Using commonly known measuring techniques, the thicknesses and sizes of the active piezo stack and the membrane may be determined. Based on such measured thicknesses and sizes, it is enabled to determine the dimension of the pressure chamber needed to ultimately obtain the desired actuator compliance.

In an embodiment, the first and the second print head layer are formed starting from a single element. In another embodiment, the first print head layer and the second print head layer are manufactured separately and the method comprises a further step of adjoining the first print head layer and the second print head layer to form the inkjet print head.

In an embodiment, the cavity having the cavity dimension is the pressure chamber. In another embodiment, the cavity forms an actuator enclosure space. In the latter embodiment, in the assembled inkjet print head, the actuator is arranged in such actuator enclosure space, for example for mechanically protecting the actuator or for protecting the actuator against moisture.

For the avoidance of doubt, although the present invention is described in relation to an inkjet print head in which the actuator compliance is defined relative to the fluid channel compliance, the present invention is similarly applicable to any other print head design wherein the actuator compliance needs to be within tight tolerances.

Further scope of applicability of the present invention will become apparent from the detailed description given hereinafter. However, it should be understood that the detailed description and specific examples, while indicating embodiments of the invention, are given by way of illustration only, since various changes and modifications within the scope of the invention will become apparent to those skilled in the art from this detailed description.

BRIEF DESCRIPTION OF THE DRAWINGS

The present invention will become more fully understood from the detailed description given hereinbelow and the accompanying schematical drawings which are given by way of illustration only, and thus are not limitative of the present invention, and wherein.

DETAILED DESCRIPTION OF THE DRAWINGS

Figure 1:
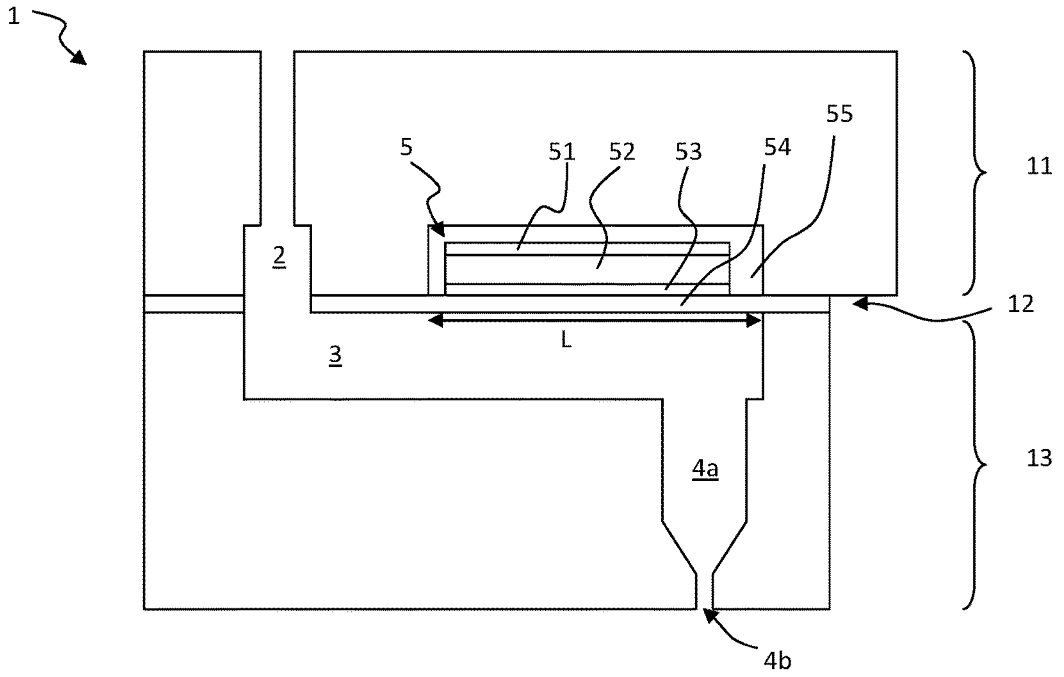
FIG. 1 schematically illustrates an exemplary design of a piezo-actuated inkjet print head.

The present invention will now be described with reference to the accompanying drawings, wherein the same reference numerals have been used to identify the same or similar elements throughout the several views.

FIG. 1 shows an example of a design of a piezo-actuated inkjet print head 1. The inkjet print head 1 is formed by a three layered structure having a supply layer 11, a membrane layer 12 and an output layer 13. A fluid channel is composed of a supply channel 2, a pressure chamber 3, an output channel 4*a* and a nozzle orifice 4*b*. The membrane layer 12 comprises a piezo actuator 5. The piezo actuator 5 is formed by a first electrode 51, a piezo material layer 52, a second electrode 53 and a membrane 54. The first electrode 51, the second electrode 53 and the piezo material layer 52 arranged therebetween together form the active piezo stack. The active piezo stack is arranged in an actuator enclosure space 55.

Upon application of a voltage over the first electrode 51 and the second electrode 53, an electrical field is provided in the piezo material layer 52 and as a consequence the piezo material layer 52 contracts or expands, in the present embodiment in a direction parallel to the membrane 54. As the piezo material layer 52 is adhered to first electrode 51 and the second electrode 53 and indirectly to the membrane 54 and as at least the membrane 54 counteracts such contraction or expansion, the piezo actuator 5 deforms by bending as illustrated in and described in relation to FIG. 2 hereinbelow.

An actuation of the actuator generates a pressure wave in a fluid present in the fluid channel. The actuation and following pressure wave eventually induces a deformation of the piezo actuator 5 and a corresponding volume change in the fluid channel, in particular in the pressure chamber 3. Thus, a suitably designed print head and a suitably generated pressure wave will result in a droplet being expelled through the nozzle orifice 4*b*, as is well known in the art.

The supply layer 11 and the output layer 13 of the inkjet print head 1 may be formed from silicon wafers. The fluid channel may be formed in such silicon wafers by well known etching methods, for example. Using silicon wafers and etching techniques allows to generate relatively small structures such that a high density arrangement of nozzle orifices 4*b* may be obtained. Thus, it may be possible to manufacture an inkjet print head 1 having a nozzle arrangement of 600 or even 1200 nozzles per inch (npi) that may be used in a printer assembly for printing at 600 or 1200 dots per inch (dpi), respectively. In a high density arrangement of nozzle orifices 4*b*, there is of course also a high density of corresponding piezo actuators 5. When operating the inkjet print head 1 drive circuitry generates an amount of heat due to power dissipation. For freedom of design, the power dissipation should be kept to a minimum. Therefore, a high energy efficiency is needed. A high energy efficiency may be achieved by obtaining a high energy coupling coefficient, i.e. a coefficient indicating a ratio of energy effectively used and energy input into the system.

In the field of piezo actuated inkjet print heads, an energy coupling coefficient of the electrical energy input and the energy effectively applied to the fluid, i.e. the acoustic energy, should be maximized for obtaining a high energy efficiency. Suitably designing the inkjet print head 1 enables to obtain a high energy coupling coefficient.

Figure 2:
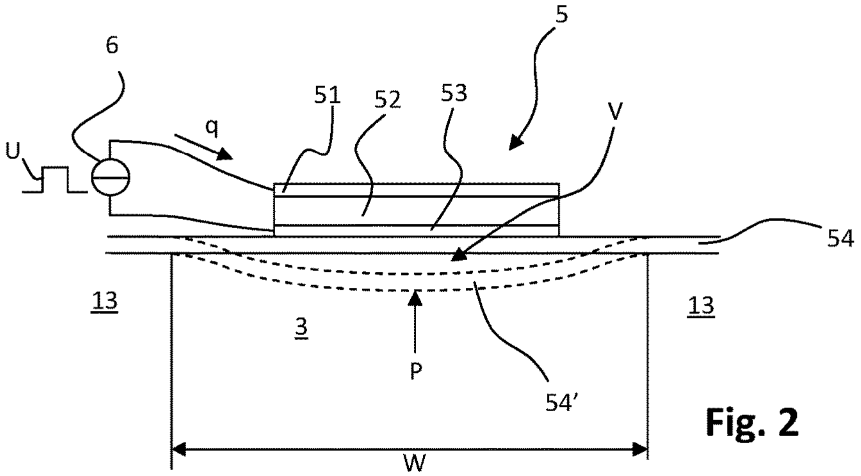
FIG. 2 illustrates a piezo-actuator as used in the print head according to FIG. 1.

FIG. 2 shows the actuator 5 of the inkjet print head 1 of FIG. 1 in more detail. A drive voltage source 6 is connected between the first electrode 51 and the second electrode 53. The drive voltage source 6 is configured for supplying a drive voltage U. The active piezo stack functions as a capacitor and consequently an electrical charge q will be supplied to the piezo actuator 5 upon supply of the drive voltage U. Due to the piezo properties of the piezo material layer 52 in response to the electrical field between the first electrode 51 and the second electrode 53, the actuator 5 will deform resulting in a shape of the membrane 54' (dashed). It is noted that the active piezo stack will of course deform to and remain on the membrane 54, but for clarity reasons the deformed active piezo stack is omitted in FIG. 2. Due to the deformation, a volume change V results in the pressure chamber 3. The fluid in the pressure chamber 3 exerts a pressure P.

Based on the above described and in FIG. 2 illustrated structure and operation, a mathematical model describing the operation of the actuator may be defined:

$$\begin{pmatrix} V \\ q \end{pmatrix} = \begin{bmatrix} A_{act} & -B_{act} \\ C_{act} & -A_{act} \end{bmatrix} \begin{pmatrix} U \\ p \end{pmatrix} \quad \text{(Eq. 2)}$$

in which A is a volume displacement per volt of the actuator, B is the actuator compliance and C is the electrical capacitance of the actuator. Based on the model as described by Eq. 2, an actuator energy coupling coefficient may be derived to be equal to:

$$k_{act}^2 = \frac{A_{act}^2}{B_{act} \cdot C_{act}} \quad \text{(Eq. 3)}$$

It is noted that $A_{act}$, $B_{act}$ and $C_{act}$ are not independent variables. Changing the actuator compliance $B_{act}$ will affect the volume displacement $A_{act}$, for example. So, in practice, it has appeared that changing the parameters of the actuator 5 within practical boundaries will not significantly affect the actuator energy coupling coefficient $k^2$. Thus, a suitably designed actuator may be presumed to have a certain actuator energy coupling coefficient $k^2$. Therefore, hereafter, the actuator energy coupling coefficient $k^2$ is presumed to be a constant for the piezo actuated inkjet print head 1.

Considering the mathematical model of the actuator 5 and taking into account the print head 1 as a whole, an acoustic energy coupling coefficient $ECC_{acoustics}$ describing the coupling between the electrical energy input and the effective acoustic energy is derivable:

$$ECC_{acoustics} = k^2 \frac{B_{act}}{B_{act} + B_{chan}} \quad \text{(Eq. 1)}$$

in which $B_{chan}$ is the compliance of the fluid channel. Taking $k^2$ as a constant as above explained, the ratio of the actuator compliance $B_{act}$ over the total system compliance, i.e. the sum of the actuator compliance $B_{act}$ and the fluid channel compliance $B_{chan}$, determines the resulting acoustic energy coupling coefficient $ECC_{acoustics}$. In general, the conclusion is to select the actuator compliance $B_{act}$ to be larger, preferably two times or even five times larger than the fluid channel compliance $B_{chan}$. In such embodiment, the ratio increases and hence the acoustic energy coupling coefficient $ECC_{acoustics}$ is maximized.

In practical situations, when designing the inkjet print head 1 and in view of controlling actuator properties, the above conclusion may be realized by adapting the fluid channel compliance $B_{chan}$ after the actuator compliance $B_{act}$ has been determined and selected. Although adapting the actuator compliance may be suitable, it is noted that a change of the actuator compliance $B_{act}$ may more impact on other aspects of the print head design. Adapting the fluid channel compliance $B_{chan}$ may be achieved by adapting dimensions of the pressure chamber 3 considering that the fluid channel compliance $B_{chan}$ has a large contribution from the compliance of the liquid present in the pressure chamber 3. While the length and width of the pressure chamber 3, i.e. the dimensions parallel to the membrane 54, have a direct relation to a membrane surface area and thus to the acoustic inkjet print head design, which should not be changed significantly to prevent changes in the acoustic design, the compliance of the liquid in the pressure chamber 3 is easily and effectively adapted by changing a depth, i.e. a dimension perpendicular to the membrane 54, of the pressure chamber 3. However, it is noted that other dimensions may be adapted such to change the fluid channel compliance, although in such case usually multiple dimensions need to be adapted to maintain the original acoustic design.

Figure 3:
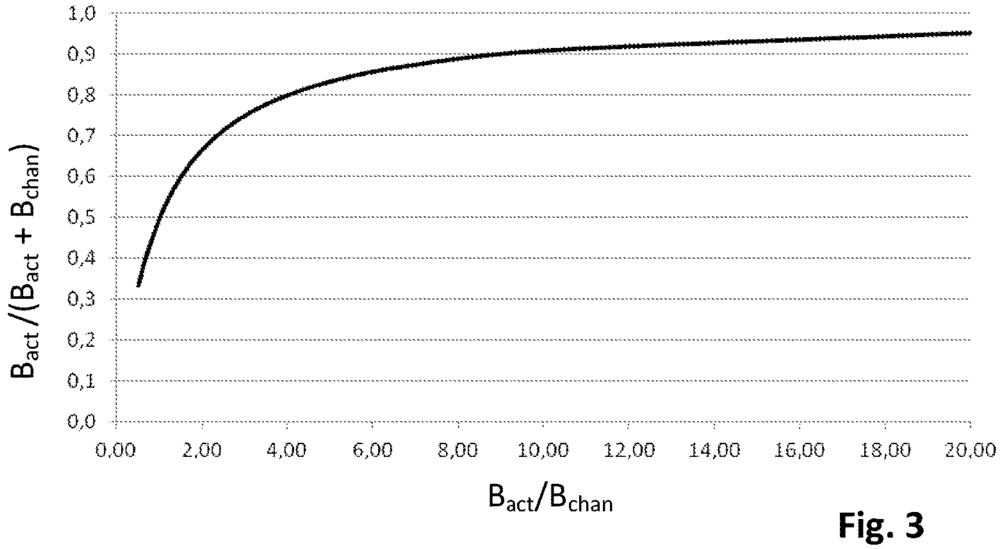
FIG. 3 shows a graph of an effect of the ratio between actuator compliance and fluid channel compliance.

FIG. 3 shows a graph that illustrates the influence of the ratio between the actuator compliance and the total compliance on the energy efficiency of the inkjet print head. The horizontal axis of the graph represents the ratio of the actuator compliance and the fluid channel compliance. The vertical axis represents the ratio of the actuator compliance and the total system compliance, which is a factor in the energy coupling coefficient as indicated in Eq. 1. This factor should be selected to be high. As is apparent from this graph, when the actuator compliance is lower than the fluid channel compliance, the ratio of the actuator compliance and the total system compliance is smaller than 0.5 and when the actuator compliance is equal to the fluid channel compliance, the ratio of the actuator compliance and the total system compliance is 0.5. Selecting the actuator compliance to be twice as large as the fluid channel compliance, the ratio between the actuator compliance and the total system compliance increases to 0.67, which amounts to an energy coupling coefficient improvement of 33% compared to the case where the actuator compliance and the fluid channel compliance are equal. In practice, it is feasible to select an actuator compliance to be as large as five times the fluid channel compliance—improvement of 67% compared to the case where the actuator compliance and the fluid channel compliance are equal—or even 10 times the fluid channel compliance—improvement of 82% compared to the case where the actuator compliance and the fluid channel compliance are equal. It is noted however that the sensitivity to deviations in the actuator compliance due to manufacturing tolerances becomes higher with increasing ratio of the actuator compliance and the fluid channel compliance, while the improvement of the energy coupling coefficient becomes minor. For example, a ratio of the actuator compliance over the fluid channel compliance of 10 results in an improvement of only 9% as compared to a ratio of 5. So, in practice, a ratio of the actuator compliance over the fluid channel compliance may be effectively selected to be in range of about 2 to about 10 and preferably in a range of about 3 to about 5.

As the actuator compliance $B_{act}$ is relatively large and thus has a strong impact on the operation of an actual inkjet print head if the actual actuator compliance $B_{act}$ deviates from a designed and desired actuator compliance $B'_{act}$ it is desired to be able to accurately control the manufacturing of the inkjet print head, in particular the actuator 5. A method of manufacturing an inkjet print head in accordance with the present invention includes controlling the actuator compliance $B_{act}$.

So, in accordance with the present invention and referring to FIG. 1, a first print head layer may be manufactured, at least including the membrane layer 12. In a first embodiment, the supply layer 11 is included in the first print head layer. In such first embodiment (considering that the supply layer 11 affects the actuator compliance, since the length L of the membrane is determined by supply layer 11), the supply layer 11 should be included in the first print head layer. Having manufactured the first print head layer of the first embodiment, all aspects contributing to the actuator compliance are present except for a pressure chamber width W (FIG. 2), which is defined in the second print head layer, which in this embodiment is formed by output layer 13. Determining one or more relevant properties of the first print head layer provides for the possibility to determine a desired flexible wall width W such that the resulting actuator compliance corresponds to the desired actuator compliance and then to use such desired flexible wall width W as a dimension for the pressure chamber 3 to be formed in the second print head layer. Thus, a high yield is obtainable, since no print heads need to be discarded due to a deviating actuator compliance.

In a second embodiment, the output layer 13 is included in the first print head layer. In such second embodiment (considering that the output layer 13 affects the actuator compliance, since the width W of the membrane (FIG. 2) is determined by output layer 13), the output layer 13 should be included in the first print head layer. Having manufactured the first print head layer of the second embodiment, all aspects contributing to the actuator compliance are present except for a flexible wall length L (FIG. 1), which is defined in the second print head layer by walls of the actuator enclosure space 55, which in this embodiment is formed by supply layer 11. Determining one or more relevant properties of the first print head layer provides for the possibility to determine a desired flexible wall length L such that the resulting actuator compliance corresponds to the desired actuator compliance and then to use such desired flexible wall length L as a dimension for the actuator enclosure space 55 to be formed in the second print head layer. Thus, a high yield is obtainable, since no print heads need to be discarded due to a deviating actuator compliance.

In a third embodiment, the first print head layer is formed by the membrane layer 12 and the active piezo stack 5 formed thereon. The membrane layer 12 may be formed from a silicon wafer having a $SiO_2$-layer (also known as a SOI-layer) and the membrane layer 12 is at least partly formed by such SOI-layer, which is very suitable in view of its etch-stop functionality. In such third embodiment, the pressure chamber 3 may be etched in the silicon base layer, which in the shown embodiment is on an opposite side of the membrane compared to the active piezo stack. Still, the silicon base layer may be regarded as the second print head layer as referred to herein.

In this third embodiment, first, the first print head layer is manufactured by providing the active piezo stack on the SOI-layer, thereby forming the piezo actuator comprising the membrane and the active piezo stack. All aspects contributing to the actuator compliance are present except for a flexible wall, since the flexible wall will be formed by providing the pressure chamber 3 in the silicon base layer, leaving the SOI-layer to form the flexible wall. It is noted that some silicon may be left too, depending a desired membrane thickness.

At least one dimension of the pressure chamber 3 (FIG. 2: width W) affects the actuator compliance. Regarding the silicon base layer as the second print head layer, the second print head layer is manufactured by providing the pressure chamber 3. For determining one or more relevant properties of the first print head layer it may be required in this third embodiment to first provide a pressure chamber 3 in a first sample using a predetermined cavity dimension. Then, having determined the one or more relevant properties of the sample, the desired flexible wall dimension (e.g. width W) may be determined and then used as a dimension for the manufacturing of another pressure chamber 3 in another second print head layer such that the resulting actuator compliance of the other inkjet print head corresponds to the desired actuator compliance. The first sample may be discarded, if the actuator compliance of the first sample did not match with the desired actuator compliance.

The step of determining the one or more properties of the first print head layer may include a step of performing impedance spectroscopy to obtain an impedance spectrum of the piezo actuator; and deriving from the impedance spectrum one or more actual actuator properties. It is noted that the impedance spectroscopy is a simple electrical measurement on the actuator.

Figure 4:
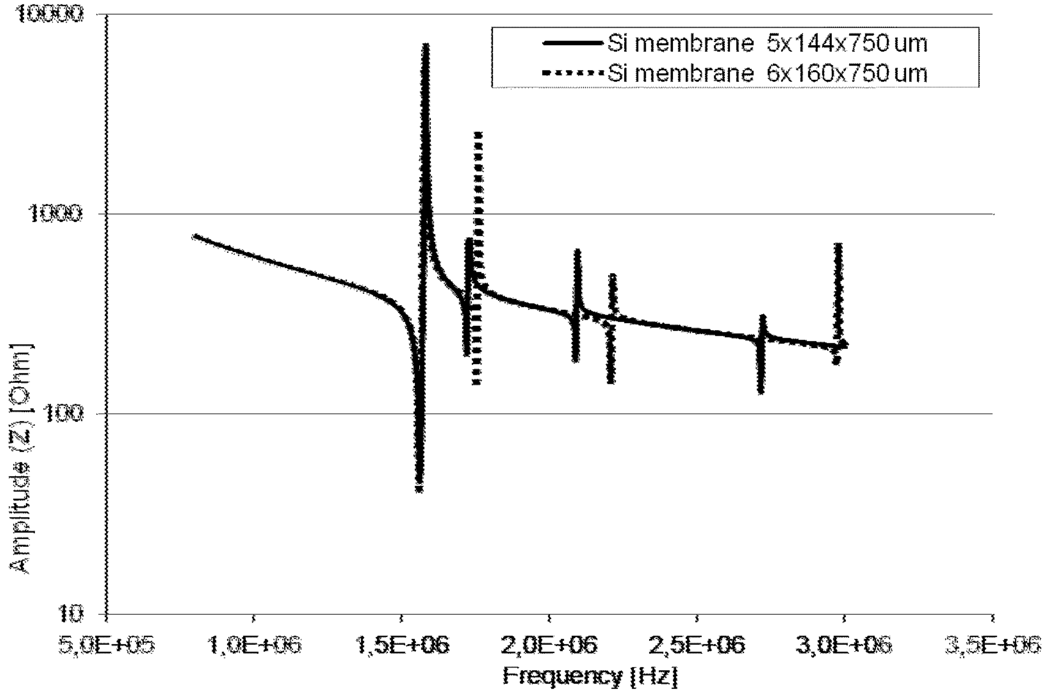
FIG. 4 shows a graph of an impedance spectrum obtained from a print head according to FIG. 1.

FIG. 4 illustrates two exemplary graphs of such an impedance spectrum. It is remarked that the illustrated impedance spectra result from a mathematical simulation. A first graph is shown with a solid line and relates to a piezo actuator having a membrane that is 5 micron in thickness, has an effective length of 750 micron and an effective width of 144 micron. A second graph is shown with a dashed line and relates to a piezo actuator having a membrane that is 6 micron in thickness, has an effective length of 750 micron and an effective width of 160 micron. The effective length and the effective width of the membrane are the length and width used in the mathematical model to represent the flexible wall part of the membrane, i.e. the functional part of the membrane. In practice, the actual length and width may be slightly different depending on, amongst other aspects, the stiffness of the clamping of the membrane between the supply layer and the output layer. For example, if a relatively thick layer of adhesive would be used for joining the supply layer, the membrane layer and the output layer, such adhesive might be flexible such that the membrane may bend beyond a boundary of the pressure chamber. In such an example, the effective length and the effective width may be larger than the actual length and the actual width of the pressure chamber, respectively. Based on the graph, it is apparent that the membrane dimensions directly affect any resonance frequencies. The first graph shows four peaks, each indicating a resonance frequency. A first resonance frequency is for the first and the second graph about the same: 1.58 MHz. The first graph shows further resonance frequencies at 1.73 MHz, 2.10 MHz and 2.72 MHz. The second graph shows further resonance frequencies at 1.76 MHz, 2.22 MHz and 2.98 MHz. These resonance frequencies allow determining the actuator compliance. As the actuator properties define the resonance frequencies, taking other parameters of the actuator design as having a predetermined value, it is enabled to determine the actuator compliance from the resonance frequencies. Such method, of course, is only feasible if it is presumed that the other actuator properties have an actual value that is close to the presumed value. In another embodiment, it is considered to determine a value of one or more of such other actuator properties.

In yet another embodiment, it is considered to employ a more detailed mathematical model that allows determining a value for multiple parameters based on the results of the impedance spectrum. In accordance with common mathematical theory, there may be derived a value for as many parameters as there are independent input values. Whether it is actually feasible to derive a usable value for multiple parameters based on a determined number of independent resonance frequencies is however dependent on more aspects than mathematical theory only. For example, a relatively high noise level may result in such low accuracy that certain obtained values would not be useful.

Defining and considering a suitable mathematical model for the inkjet print head acoustics and related calculations for deriving values of certain parameters from an impedance spectrum is deemed to be within the ambit of the person skilled in the art and is not further elucidated here.

For more detailed discussion of properties and determining/measuring of such properties, reference is made to ANSI/IEEE Std 176-1987 and/or NEN-EN 50324-2:2002. For example, the former provides a mathematical equation describing the impedance spectrum based on properties of the piezo material.

It is noted that it may prove difficult to perform impedance spectroscopy on the first print head layer alone, since some structural elements may not have sufficient stiffness in such circumstances as the stiffness may be obtained only after assembling the inkjet print head, i.e. after adjoining the first and the second print head layers. Taking into account that the relevant aspects and dimensions of the first print head layer affecting the actuator compliance are substantially similar within a batch, one or a limited number of first print head layers may be adjoined to a corresponding number of second print head layers forming print head samples. The impedance spectroscopy may then be performed on such samples. Based on the results of the impedance spectroscopy on such samples, the desired wall dimension may be derived and applied on the cavities to be formed in the second print head layers to be adjoined to the remaining first print head layers.

Figure 5:
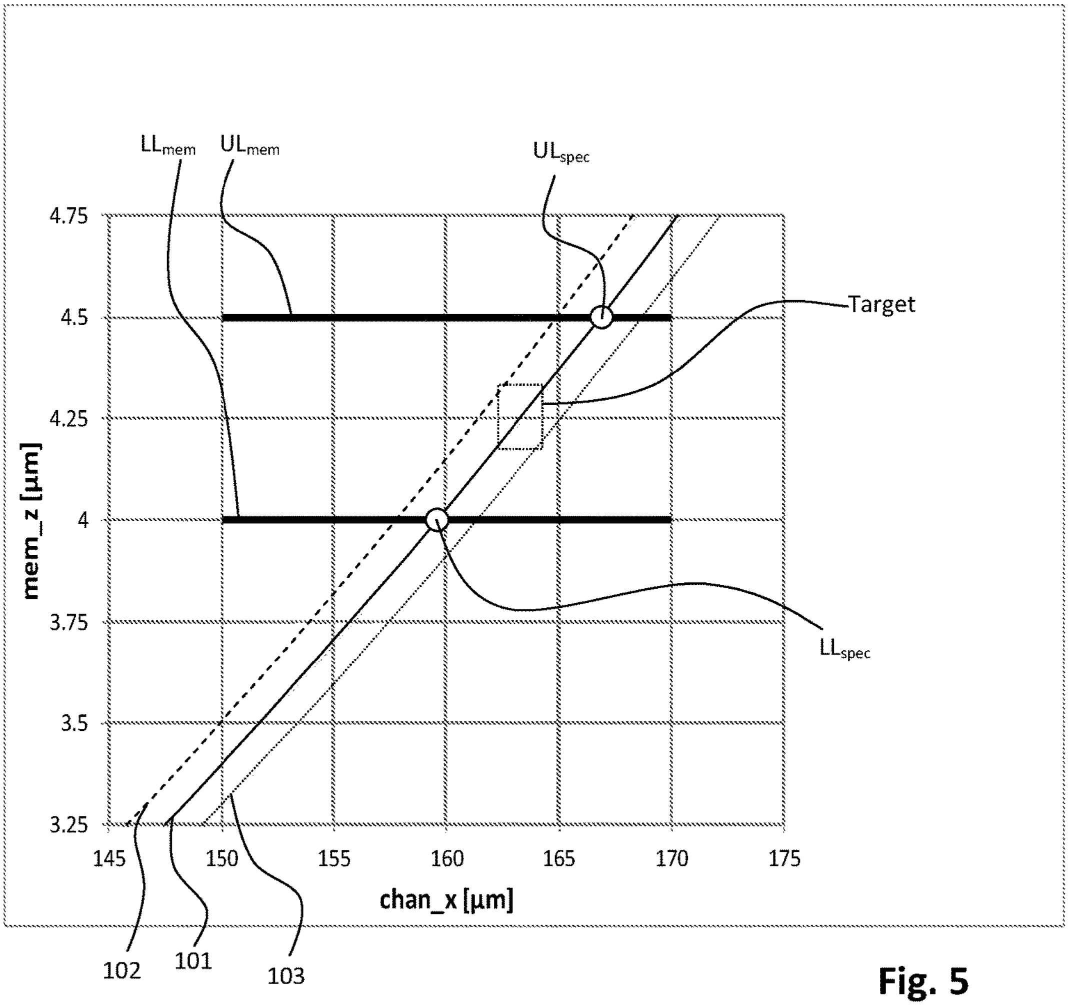
FIG. 5 shows a graph illustrating the method according to the present invention.

FIG. 5 illustrates an embodiment of the method according to the present invention in more detail. In this exemplary embodiment, the adaptable wall dimension is the pressure chamber width, wherein the pressure chamber is thus arranged in the second print head layer. The actual actuator property used for determining a desired pressure chamber width is the membrane thickness, which is a major contributor to the resulting actuator compliancy and is at the same time a property that is known during manufacturing to drift over time, in particular to vary between batches. So, in the graph of FIG. 5, the horizontal axis represents the pressure chamber width ('chan_x') in micrometers and the vertical axis represents a membrane thickness ('mem_z') in micrometers.

A first curve 101 represents the combinations of pressure chamber width and membrane thickness that result in an actuator compliancy of 3.8 pl/bar, which is the desired actuator compliancy. A second curve 102 represents the combinations of pressure chamber width and membrane thickness that result in an actuator compliancy of 3.6 pl/bar, while a third curve 103 represents the combinations of pressure chamber width and membrane thickness that result in an actuator compliancy of 4.0 pl/bar. In this embodiment, the target values are indicated by the dotted rectangle Target. So, the target value for the actuator compliancy is 3.8 pl/bar with a membrane thickness of about 4.25 micrometer and a pressure chamber width of about 163 micrometer. However, minor variations in membrane thickness result in significant changes in the actual actuator compliance. For example, with a membrane thickness of about 4.4 micrometer (i.e. a deviation of only +150 nanometer), results in the actual actuator compliancy becoming 3.6 pl/bar, which significantly changes the fluid dynamics in the print head during operation and may result in an undesired droplet size, an undesired droplet speed, ejection instability and other operational defects.

During manufacturing, the membrane thickness may drift from a desired thickness of 4.25 micrometer to a lower limit value $LL_{mem}$ of about 4.0 micrometer to an upper limit value $UL_{mem}$ of about 4.5 micrometer. In that range between 4.0 to 4.5 micrometer, with a constant pressure chamber width, the actual actuator compliance may vary over a range of about 0.8 pl/bar (e.g. at a pressure chamber width of about 163 micrometer, it may be expected that the compliance is from about 4.2 pl/bar with a membrane thickness of about 4.0 micrometer to about 3.4 pl/bar with a membrane thickness of about 4.5 micrometer).

On the other hand, in accordance with the present invention, taking the desired actuator compliance at 3.8 pl/bar (first curve 101) and accepting a lower limit $LL_{spec}$ and an upper limit $UL_{spec}$ for the membrane thickness specification, it is easily derivable that adaptation of the pressure chamber width can resolve the manufacturing tolerance problem. So, first manufacturing the first print head layer comprising the membrane allows measuring the membrane thickness. Having measured the membrane thickness, the graph of FIG. 5 assists in determining a suitable pressure chamber width for obtaining the desired actuator compliance. For example, assuming a measured membrane thickness of 4.1 micrometer, the desired actuator compliance of 3.8 pl/bar represented by the first curve 101 is obtained with a pressure chamber width of about 161 micrometer. Then, using such determined desired pressure chamber width of 161 micrometer, the second print head layer can be manufactured with a pressure chamber having a pressure chamber width of 161 micrometer. As the pressure chamber width is accurately and more stably controlled during manufacturing, the actual actuator compliance after adjoining the first print head layer and the second print head layer will be closer to the desired actuator compliance with a higher yield when compared to the known prior art methods.

While detailed embodiments of the present invention are disclosed herein, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. In particular, features presented and described in separate dependent claims may be applied in combination and any advantageous combination of such claims is herewith disclosed.

Further, the terms and phrases used herein are not intended to be limiting; but rather, to provide an understandable description of the invention. The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A method of manufacturing an inkjet print head for expelling a droplet of a fluid through a nozzle orifice, the inkjet print head comprising a fluid channel for holding a channel amount of fluid, the fluid channel comprising a pressure chamber in fluid communication with the nozzle orifice;

a piezo actuator comprising an active piezo stack, comprising a first electrode, a second electrode, and a piezo-material layer arranged between the first and the second electrode; and a membrane, the active piezo stack being provided at a surface of the membrane and the membrane forming a flexible wall of the pressure chamber, and a cavity having a cavity dimension determining a wall dimension of the membrane;

wherein the piezo-actuator is arranged to deform by bending upon application of a voltage over the first electrode and the second electrode, and the piezo actuator has an actuator compliance; and the method comprising the steps of a. selecting a desired actuator compliance;

b. manufacturing a first print head layer comprising the piezo actuator;

c. determining at least one actual actuator property of the piezo-actuator manufactured in step b;

d. determining a desired wall dimension based on the actual actuator property determined in step b such that the combination of the piezo actuator manufactured in step b and the membrane having the desired wall dimension provides for the desired actuator compliance selected in step a;

e. manufacturing a second print head layer comprising the cavity, the cavity having the cavity dimension corresponding to the desired wall dimension determined in step d such that the piezo actuator of the assembled inkjet print head has an actual actuator compliance corresponding to the desired actuator compliance; and f. assembling the first print head layer and the second print head layer to provide an assembled state for the inkjet print head.

2. The method of manufacturing an inkjet print head according to claim 1, wherein step c of the method comprises the steps of c1. performing impedance spectroscopy on the first print head layer to obtain an impedance spectrum; and c2. deriving from the impedance spectrum the actual actuator property.

3. The method of manufacturing an inkjet print head according to claim 1, wherein step c of the method comprises the step of c3. determining an actual dimension of the piezo actuator.

4. The method according to claim 1, wherein the first print head layer and the second print head layer are manufactured separately, and wherein step f of the method comprises adjoining the first print head layer and the second print head layer to form the inkjet print head.

5. The method according to claim 1, wherein, in the assembled state, the cavity forms the pressure chamber of the inkjet print head.

6. The method according to claim 1, wherein, in the assembled state, the cavity forms an actuator enclosure space, the active piezo stack being arranged in the actuator enclosure space.

* * * * *